(12) United States Patent
Ayotte et al.

(10) Patent No.: US 7,709,876 B2
(45) Date of Patent: May 4, 2010

(54) GAP CAPACITORS FOR MONITORING STRESS IN SOLDER BALLS IN FLIP CHIP TECHNOLOGY

(75) Inventors: Stephen P. Ayotte, Bristol, VT (US); Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 12/028,845

(22) Filed: Feb. 11, 2008

(65) Prior Publication Data
US 2009/0201626 A1    Aug. 13, 2009

(51) Int. Cl.
*H01L 27/108*    (2006.01)
(52) U.S. Cl. .................. 257/296; 257/298; 257/300; 257/E27.075; 257/E27.084
(58) Field of Classification Search .............. 257/296, 257/532
See application file for complete search history.

(56) References Cited

U.S. PATENT DOCUMENTS

| 3,451,030 | A | 6/1969 | Garfinkel |
| 5,808,853 | A | 9/1998 | Dalal et al. |
| 6,744,335 | B2 | 6/2004 | Ryhänen et al. |
| 6,898,070 | B2 | 5/2005 | Korony et al. |
| 2006/0205106 | A1 | 9/2006 | Fukuda et al. |
| 2007/0062299 | A1 | 3/2007 | Mian et al. |
| 2007/0145523 | A1* | 6/2007 | Chow et al. .................. 257/528 |

\* cited by examiner

*Primary Examiner*—Long K Tran
(74) *Attorney, Agent, or Firm*—Schmeiser, Olsen & Watts; Richard M. Kotulak

(57) ABSTRACT

A semiconductor structure and a method for forming the same. The structure includes (i) a dielectric layer, (ii) a bottom capacitor plate and an electrically conductive line on the dielectric layer, (iii) a top capacitor plate on top of the bottom capacitor plate, (iv) a gap region, and (v) a solder ball on the dielectric layer. The dielectric layer includes a top surface that defines a reference direction perpendicular to the top surface. The top capacitor plate overlaps the bottom capacitor plate in the reference direction. The gap region is sandwiched between the bottom capacitor plate and the top capacitor plate. The gap region does not include any liquid or solid material. The solder ball is electrically connected to the electrically conductive line. The top capacitor plate is disposed between the dielectric layer and the solder ball.

10 Claims, 9 Drawing Sheets

GAP CAPACITORS FOR MONITORING STRESS IN SOLDER BALLS IN FLIP CHIP TECHNOLOGY

FIELD OF THE INVENTION

The present invention relates generally to flip chip technology and more particularly to gap capacitors for monitoring stress in solder balls in flip chip technology.

BACKGROUND OF THE INVENTION

In flip chip technology, the attachment of the solder balls of a chip to the substrate pads of a ceramic substrate usually results in stress in the solder balls. Therefore, there is a need for a structure (and a method for forming the same) for monitoring the stress in the solder balls.

SUMMARY OF THE INVENTION

The present invention provides a semiconductor structure, comprising a dielectric layer which includes a top surface, wherein the top surface defines a reference direction perpendicular to the top surface; a bottom capacitor plate and an electrically conductive line on the dielectric layer, wherein the bottom capacitor plate comprises a first electrically conductive material, and wherein the electrically conductive line comprises a second electrically conductive material; a top capacitor plate on top of the bottom capacitor plate, wherein the top capacitor plate comprises a third electrically conductive material, and wherein the top capacitor plate overlaps the bottom capacitor plate in the reference direction; a gap region, wherein the gap region is sandwiched between the bottom capacitor plate and the top capacitor plate, and wherein the gap region does not comprise any liquid or solid material; and a solder ball on the dielectric layer, wherein the solder ball comprises a fourth electrically conductive material, wherein the solder ball is electrically connected to the electrically conductive line, and wherein the top capacitor plate is disposed between the dielectric layer and the solder ball.

The present invention provides a structure (and a method for forming the same) for monitoring the stress in the solder balls.

BRIEF DESCRIPTION OF THE DRAWINGS

FIG. 1F' shows a top-down view of the structure of FIG. 1F, in accordance with embodiments of the present invention.

FIG. 1O' shows a top-down view of the structure of FIG. 1O, in accordance with embodiments of the present invention.

DETAILED DESCRIPTION OF THE INVENTION

Figure 1A:
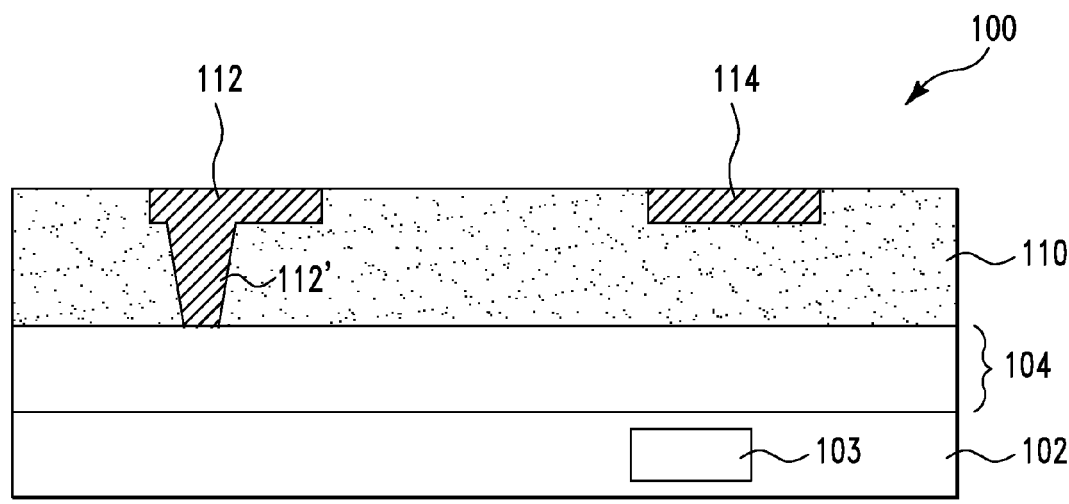
FIG. 1A shows a cross-section view of a semiconductor structure for illustrating a fabrication process, in accordance with embodiments of the present invention.
Figure 1B:
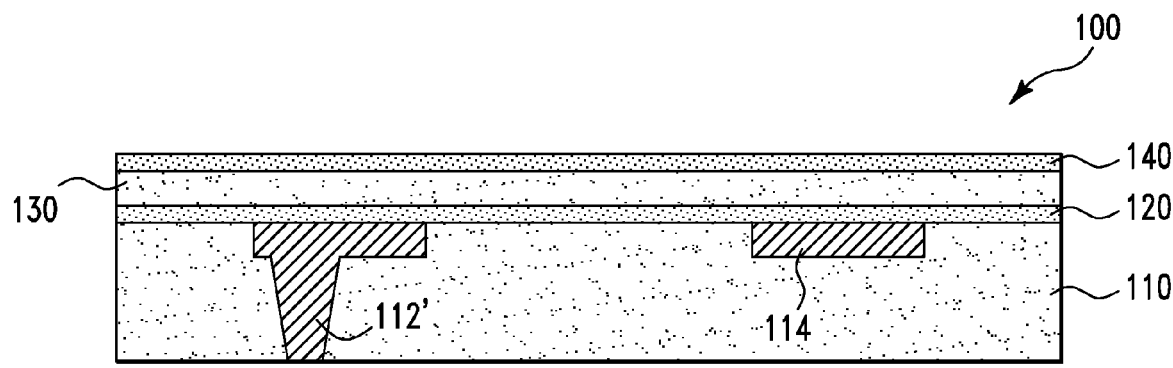
FIG. 1B shows a cross-section view of a semiconductor structure resulting from forming three dielectric layers on the structure of FIG. 1A, in accordance with embodiments of the present invention.
Figure 1C:
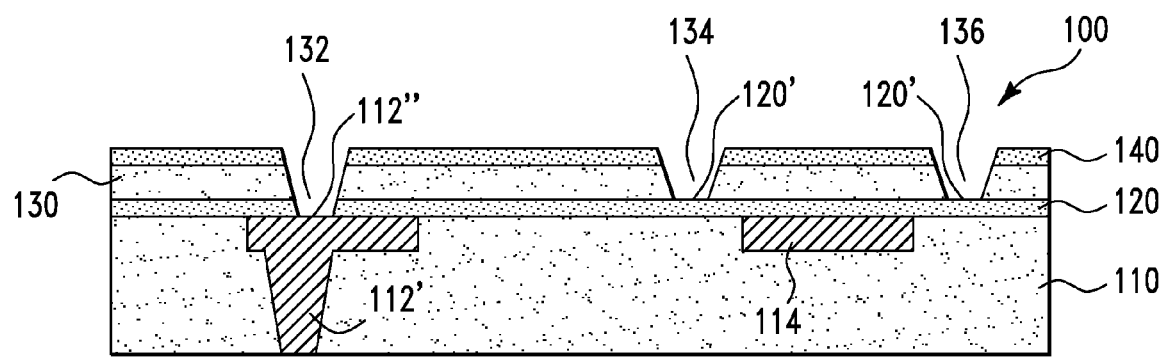
FIG. 1C shows a cross-section view of a semiconductor structure resulting from forming a terminal via hole and gap trenches in the three dielectric layers of the structure of FIG. 1B, in accordance with embodiments of the present invention.
Figure 1D:
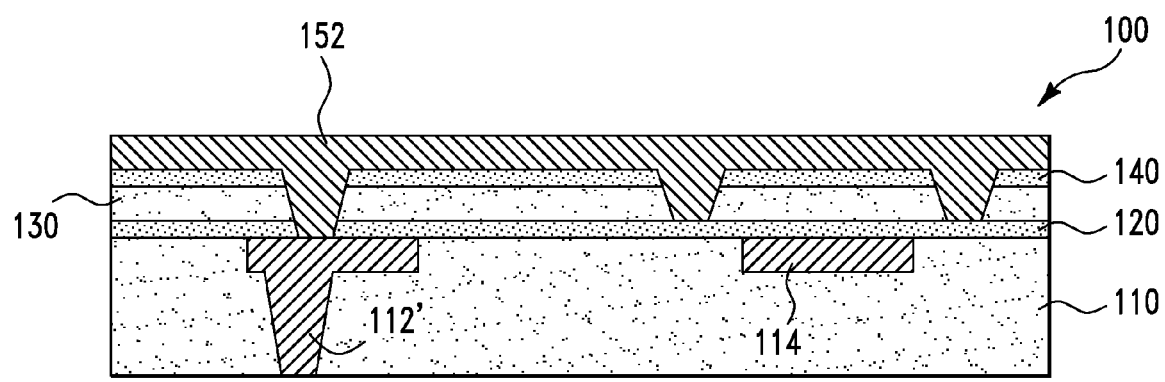
FIG. 1D shows a cross-section view of a semiconductor structure resulting from forming an aluminum layer on the structure of FIG. 1C, in accordance with embodiments of the present invention.
Figure 1E:
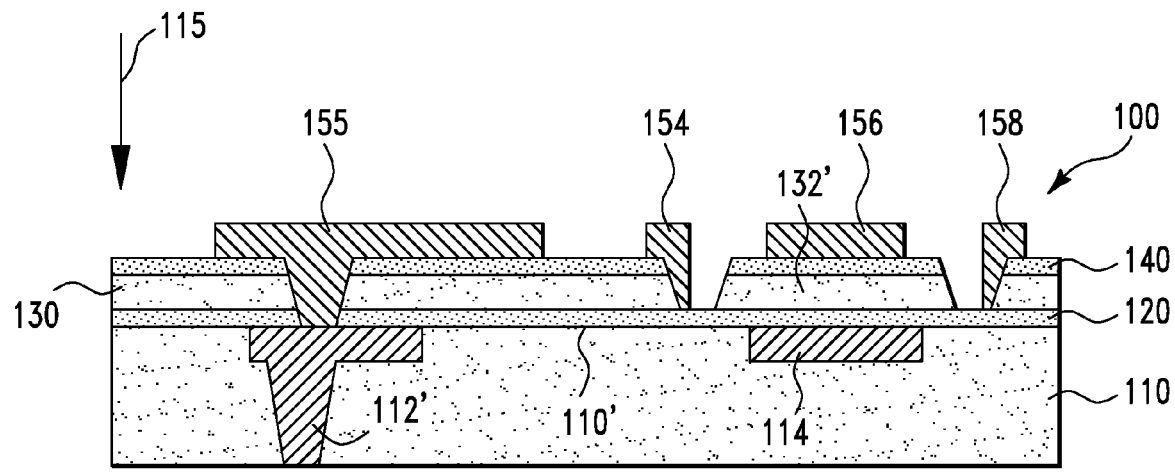
FIG. 1E shows a cross-section view of a semiconductor structure resulting from patterning the aluminum layer of the structure of FIG. 1D, in accordance with embodiments of the present invention.
Figure 1F:
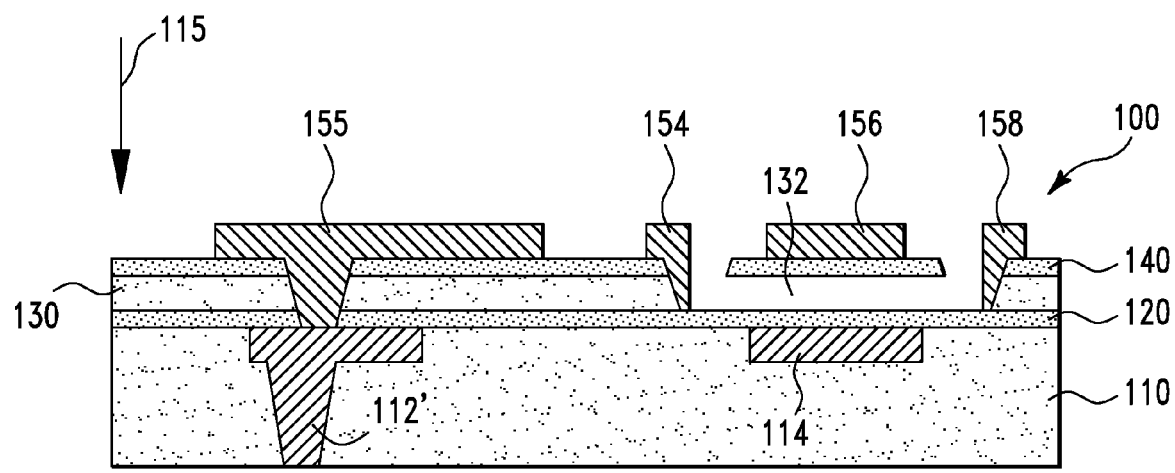
FIG. 1F shows a cross-section view of a semiconductor structure resulting from removing a portion of the dielectric layer of the structure of FIG. 1E, in accordance with embodiments of the present invention.
Figure 1F:
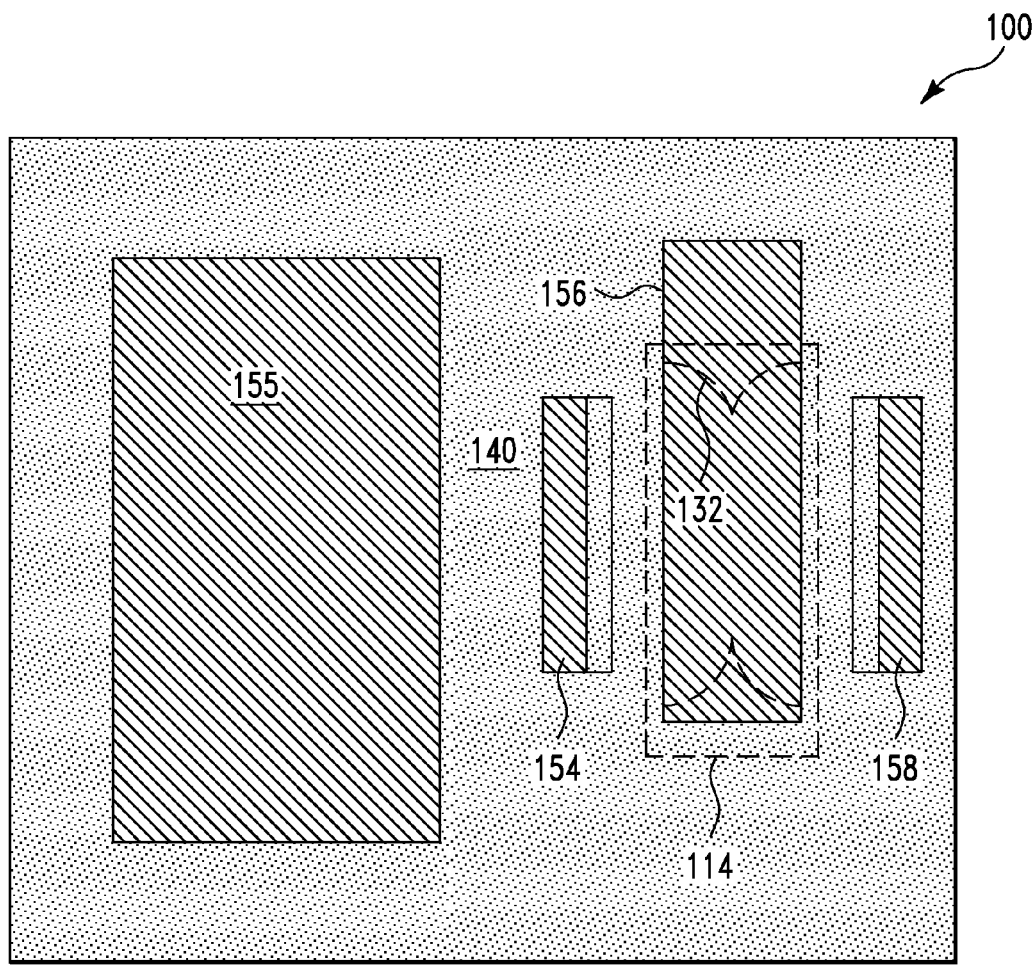
Figure 1G:
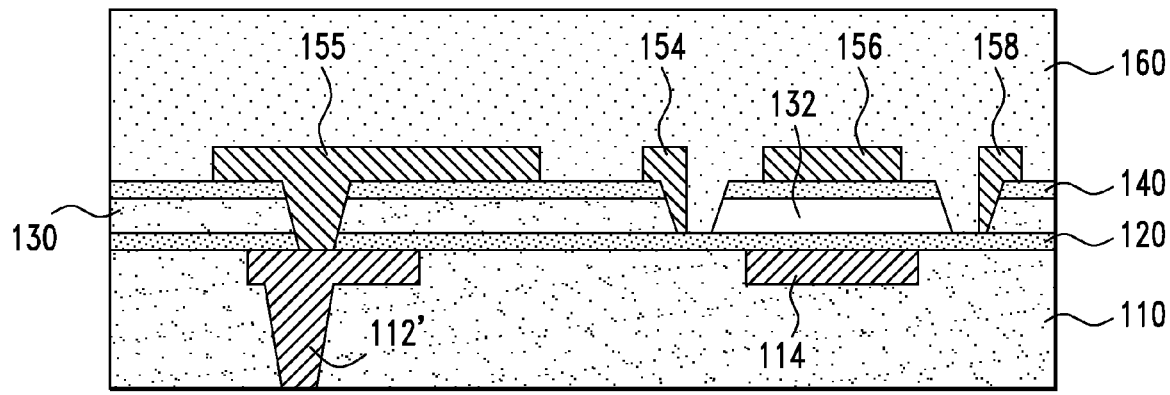
FIG. 1G shows a cross-section view of a semiconductor structure resulting from forming a polyimide layer on the structure of FIG. 1F, in accordance with embodiments of the present invention.
Figure 1H:
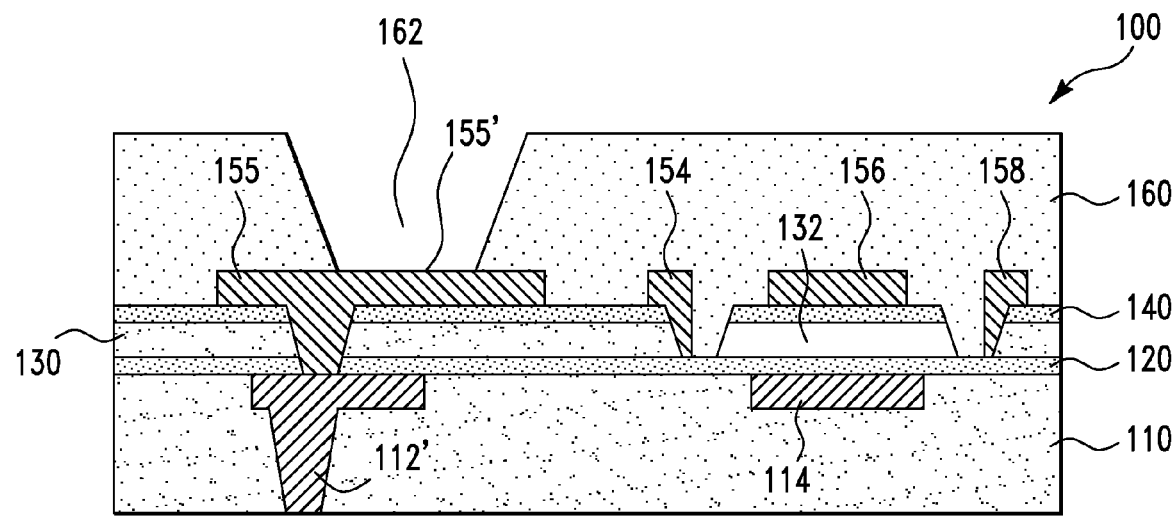
FIG. 1H shows a cross-section view of a semiconductor structure resulting from forming a final via hole in the polyimide layer of the structure of FIG. 1G, in accordance with embodiments of the present invention.
Figure 1I:
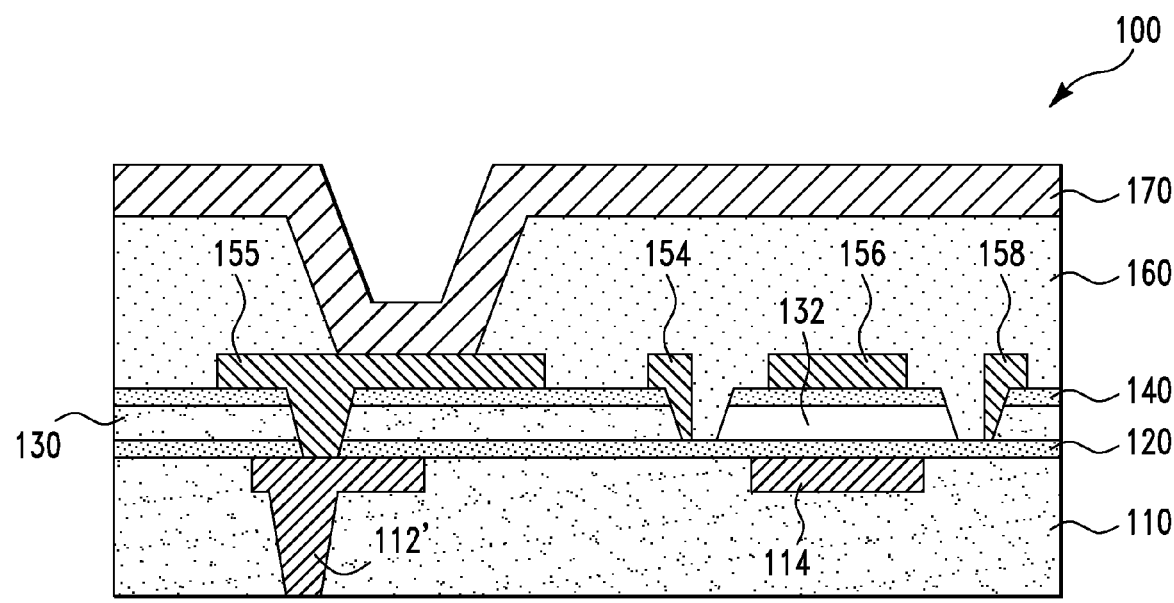
FIG. 1I shows a cross-section view of a semiconductor structure resulting from forming a ball-limiting-metallurgy (BLM) layer on the structure of FIG. 1H, in accordance with embodiments of the present invention.
Figure 1J:
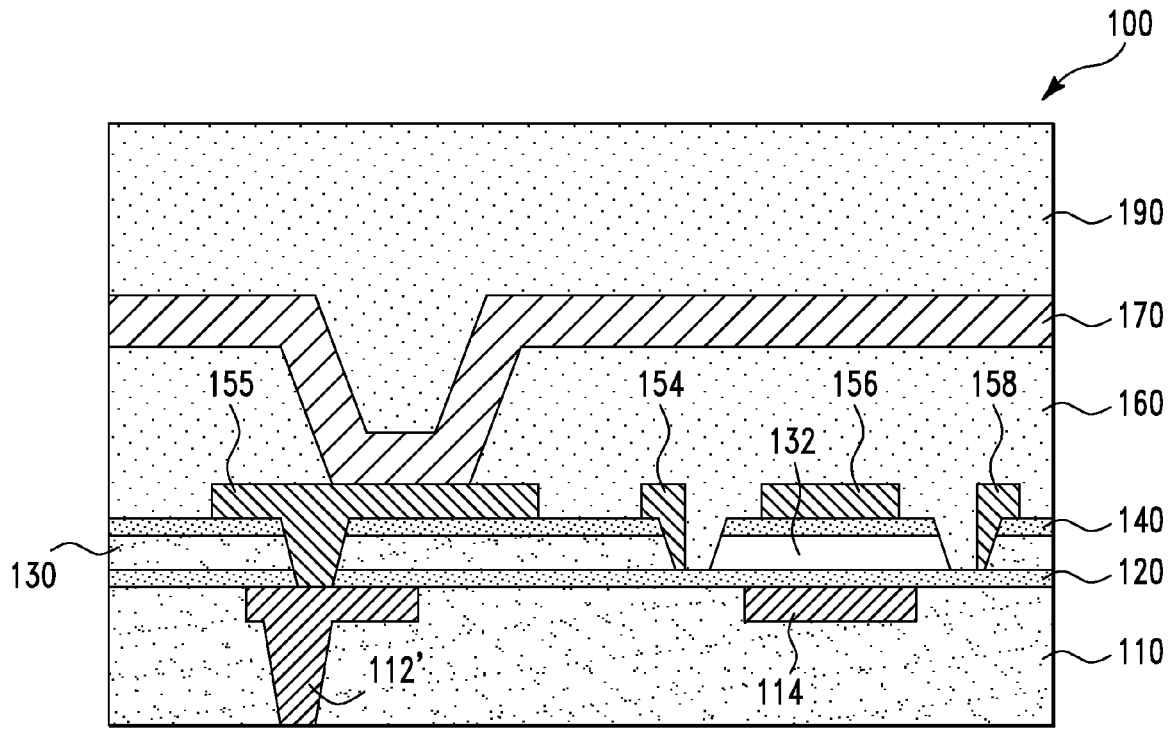
FIG. 1J shows a cross-section view of a semiconductor structure resulting from forming a photoresist layer on the structure of FIG. 1I, in accordance with embodiments of the present invention.
Figure 1K:
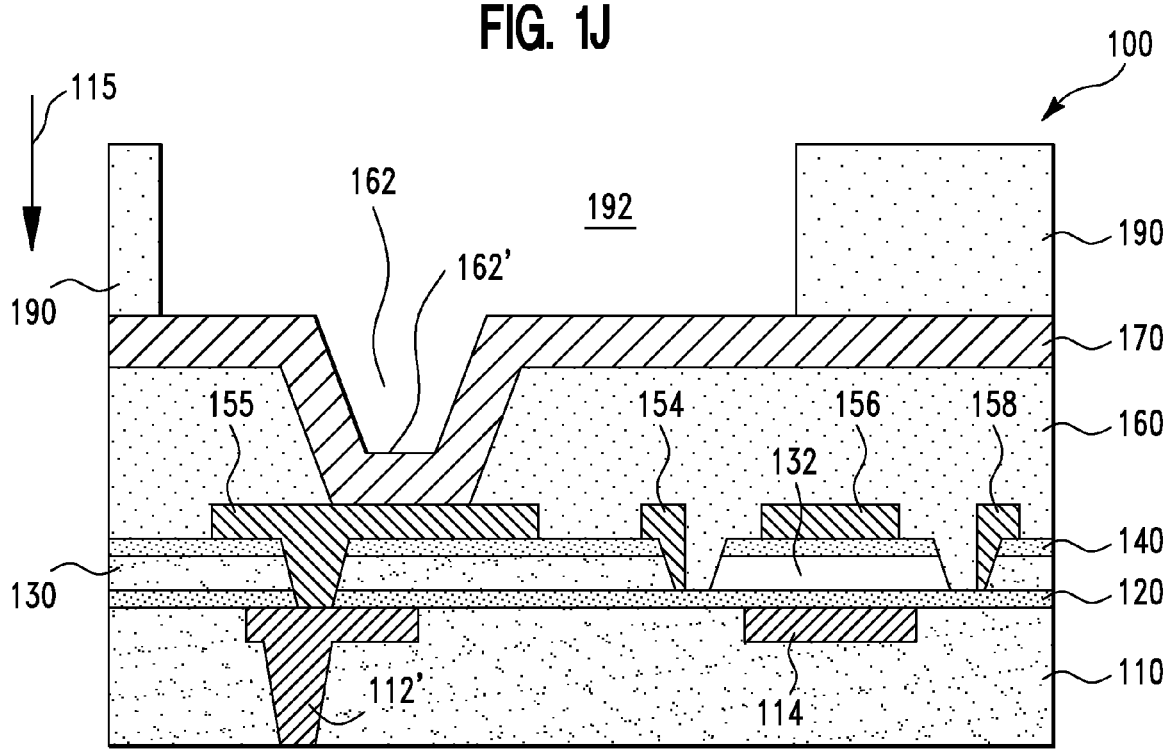
FIG. 1K shows a cross-section view of a semiconductor structure resulting from forming a hole in the photoresist layer of the structure of FIG. 1J, in accordance with embodiments of the present invention.
Figure 1L:
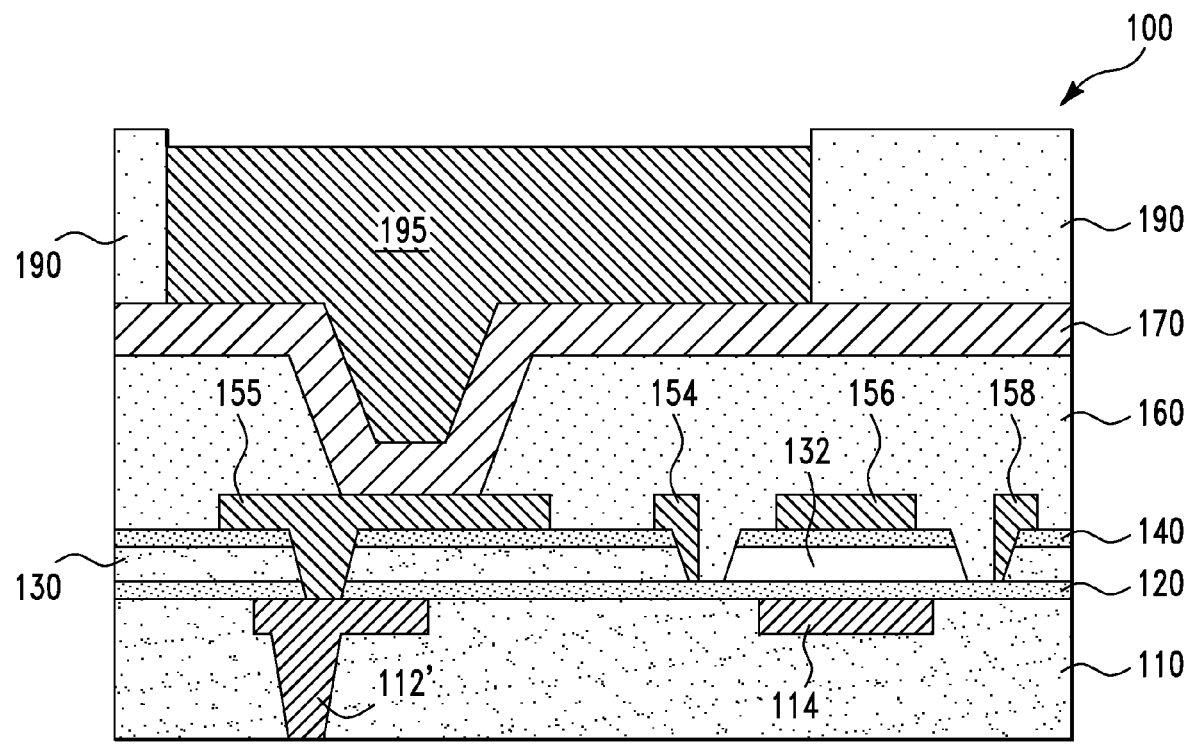
FIG. 1L shows a cross-section view of a semiconductor structure resulting from forming a solder ball region in the hole of the structure of FIG. 1K, in accordance with embodiments of the present invention.
Figure 1M:
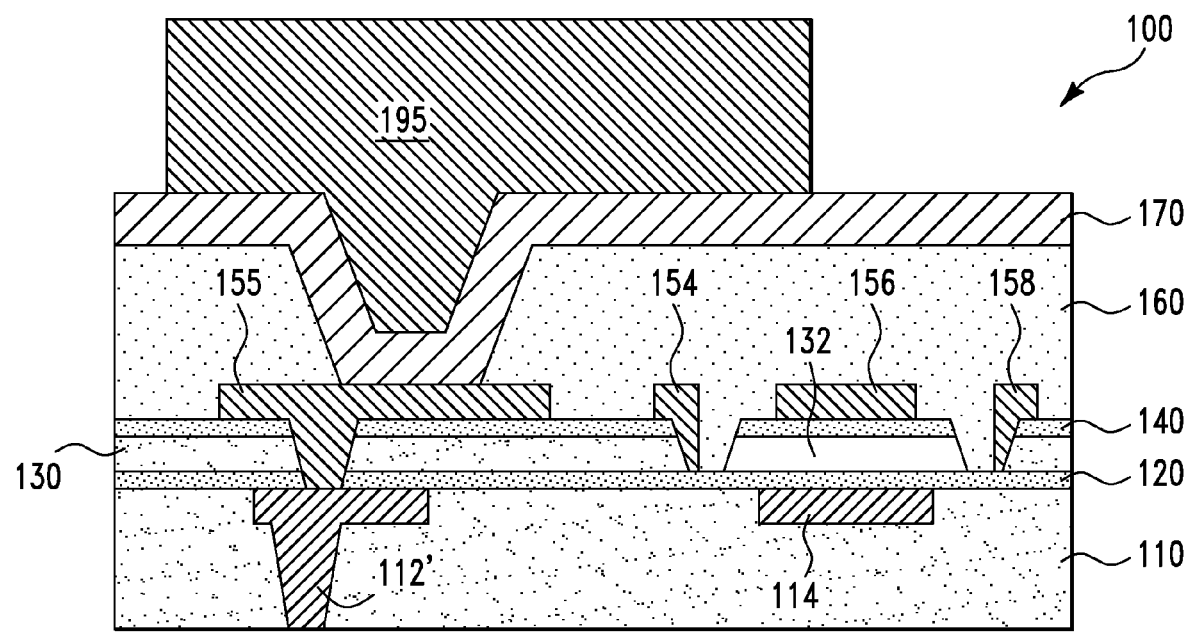
FIG. 1M shows a cross-section view of a semiconductor structure resulting from removing the photoresist layer of the structure of FIG. 1K, in accordance with embodiments of the present invention.
Figure 1N:
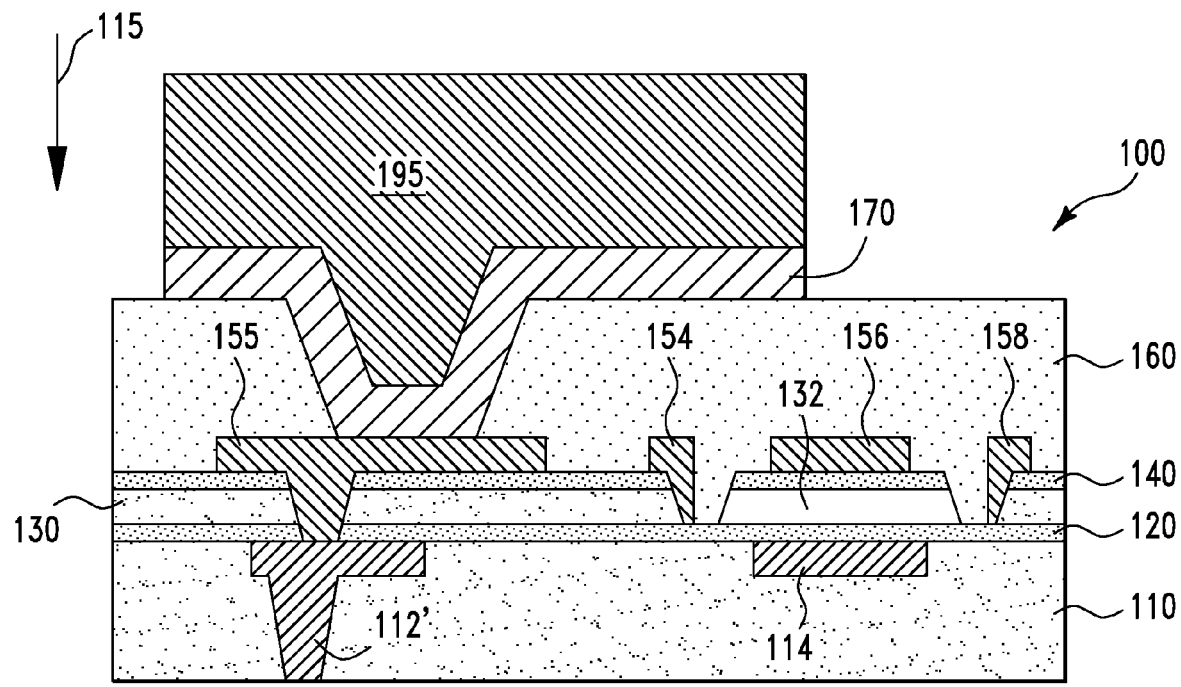
FIG. 1N shows a cross-section view of a semiconductor structure resulting from patterning the BLM layer of the structure of FIG. 1M, in accordance with embodiments of the present invention.
Figure 1O:
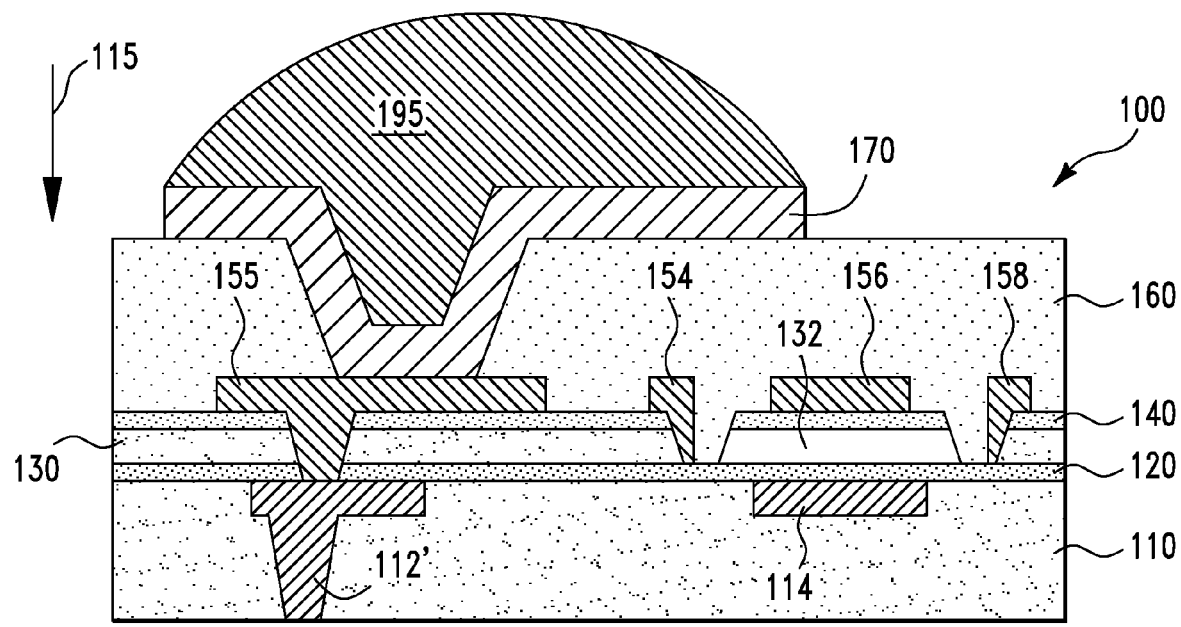
FIG. 1O shows a cross-section view of a semiconductor structure resulting from heating and reshaping the solder ball region of the structure of FIG. 1N, in accordance with embodiments of the present invention.
Figure 10:
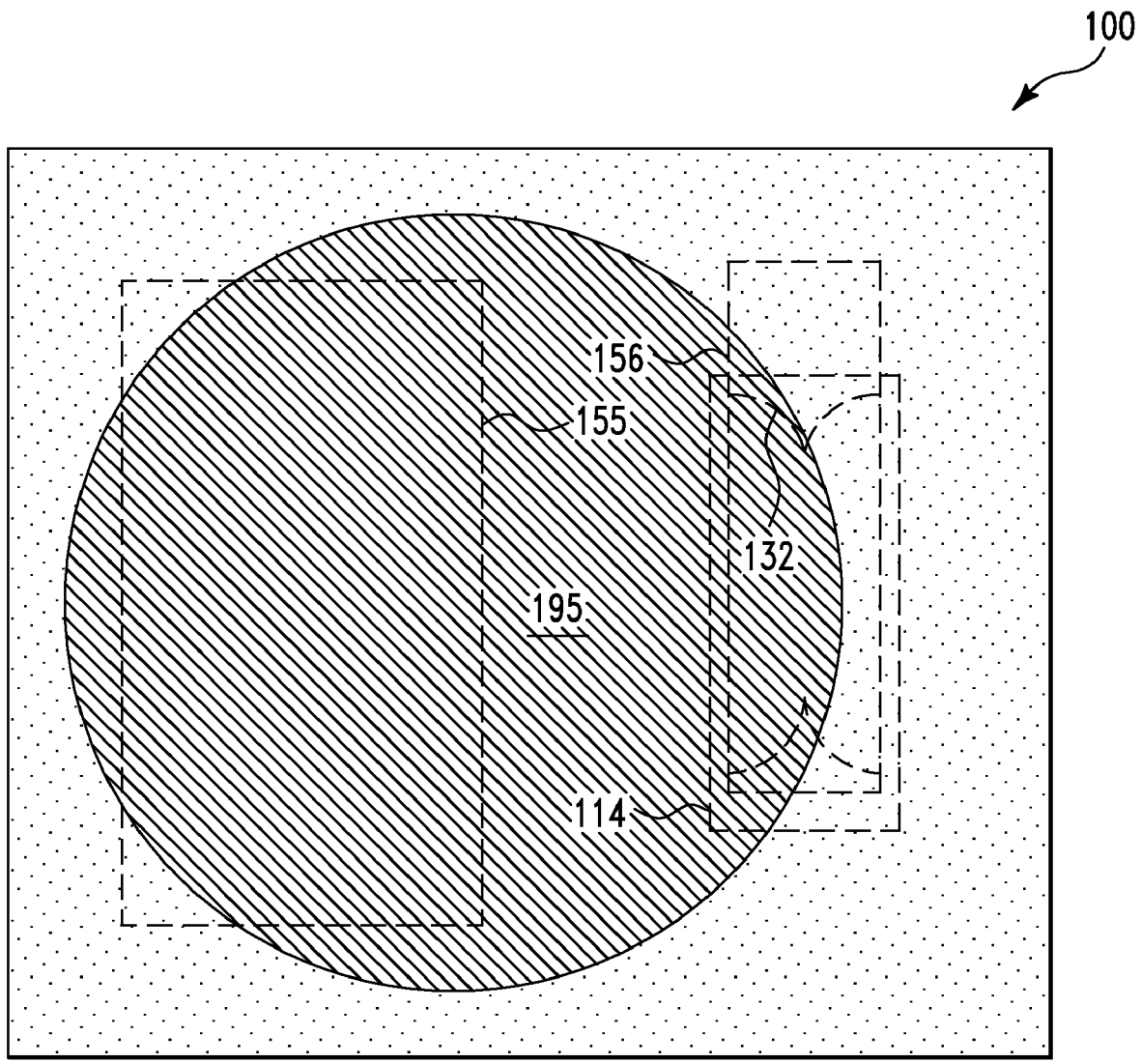

FIGS. 1A-1O' illustrate a fabrication process of a semiconductor structure 100, in accordance with embodiments of the present invention. More specifically, with reference to FIG. 1A (cross-section view), the fabrication process of the semiconductor structure 100 can start with an inter-level dielectric (ILD) layer 110. The ILD layer 110 is on top of underlying interconnect layers 104. The ILD layer 110 can be a top ILD layer of a semiconductor integrated circuit 102. The ILD layer 110 can comprise a dielectric material such as silicon dioxide.

Next, in one embodiment, a metal line 112, a via 112', and a bottom capacitor plate 114 are formed in the ILD layer 110. The via 112' provides electrical access from the metal line 112 to devices (not shown) of the semiconductor integrated circuit 102 through the underlying interconnect layers 104. In one embodiment, the bottom capacitor plate 114 is electrically connected to a capacitive sensor device 103 of the integrated circuit 102 through an electrical path that goes through the ILD layer 110, and the underlying interconnect layers 104. The metal line 112, the via 112', and the bottom capacitor plate 114 can comprise copper. The metal line 112, the via 112', and the bottom capacitor plate 114 can be formed by a conventional dual damascene process. It should be noted that, in the following figures, the interconnect layers 104 and the integrated circuit 102 are not shown for simplicity.

Next, with reference to FIG. 1B, in one embodiment, a passivation layer 120+130+140 is formed on top of the structure 100 of FIG. 1A. The passivation layer comprises dielectric layers 120, 130, and 140. The dielectric layers 120 and 140 can comprise silicon nitride. The dielectric layer 130 can comprise silicon dioxide. The dielectric layers 120, 130, and 140 can be formed in turn by conventional CVD (Chemical Vapor Deposition) processes.

Next, with reference to FIG. 1C, in one embodiment, a terminal via hole 132 and gap trenches 134 and 136 are formed in the passivation layer 120+130+140 such that (i) the top surface 112" of the metal line 112 is exposed to the surrounding ambient through the terminal via hole 132 and (ii) the top surface 120' of the dielectric layer 120 is exposed to the surrounding ambient through the gap trenches 134 and 136. The gap trenches 134 and 136 run in a direction perpendicular to the page. The terminal via hole 132 and the gap trenches 134 and 136 can be formed by lithographic and etching processes.

Next, with reference to FIG. 1D, in one embodiment, an electrically conductive layer 152 is formed on top of the structure 100 of FIG. 1C such that the terminal via hole 132 and the gap trenches 134 and 136 are filled with the electrically conductive layer 152. The electrically conductive layer 152 can comprise an electrically conductive material such as aluminum. The electrically conductive layer 152 can be formed by PVD (Physical Vapor Deposition).

Next, in one embodiment, the electrically conductive layer 152 is patterned resulting in a bond pad 155, a top capacitor plate 156, and barrier regions 154 and 158 of FIG. 1E. The electrically conductive layer 152 can be patterned by lithographic and etching processes. With reference to FIG. 1E, the top capacitor plate 156 can overlap the bottom capacitor plate 114 in a direction defined by an arrow 115 (hereafter can be referred to as the direction 115). The direction 115 is perpendicular to the top surface 110' of the ILD layer 110 and points from the top capacitor plate 156 to the ILD layer 110. A first region is said to overlap a second region in a reference direction if and only if there exits at least one point inside the first region such that a straight line going through that point and being parallel to the reference direction would intersect the second region. In one embodiment, with reference to FIGS. 1A and 1E, the top capacitor plate 156 is electrically connected to the capacitive sensor device 103 of the integrated circuit 102 through an electrical path that goes through the passivation layer 120+130+140, the ILD layer 110, and the underlying interconnect layers 104.

Next, in one embodiment, the dielectric region 132' of the dielectric layer 130 is removed resulting in a gap region 132 of FIG. 1F. The dielectric region 132' is sandwiched between the bottom capacitor plate 114 and the top capacitor plate 156. The dielectric region 132' can be removed by a wet etching process such as dilute hydrofluoric acid (DHF) etch. The gap region 132 can still contain gases, vapors, and/or vacuum, but does not contain any liquid or solid material. FIG. 1F' shows a top-down view of the structure 100 of FIG. 1F. In one embodiment, a portion of the gap region 132 entirely overlaps both the bottom capacitor plate 114 and the top capacitor plate 156 in the direction 115. For simplicity, the portion of the gap region 132 which entirely overlaps both the bottom capacitor plate 114 and the top capacitor plate 156 in the direction 115 is shown in FIG. 1F'. It is said that a third region entirely overlaps a fourth region in a reference direction tin if, for any point of the third region, a straight line going through that point and being parallel to the reference direction would intersect the fourth region.

Next, with reference to FIG. 1G, in one embodiment, a passivation layer 160 is formed top of the structure 100 of FIG. 1F. The passivation layer 160 can comprise polyimide. If polyimide is used, the passivation layer 160 can be formed by a conventional spin-on process.

Next, with reference to FIG. 1H, in one embodiment, a final via hole 162 is formed in the passivation layer 160 such that the top surface 155' of the bond pad 155 is exposed to the surrounding ambient through the final via hole 162. If the passivation layer 160 comprises polyimide, then the final via hole 162 can be formed by a conventional lithographic process.

Next, with reference to FIG. 1I, a ball-limiting-metallurgy (BLM) layer 170 is formed on top of the structure 100 of FIG. 1H. The BLM layer 170 can comprise a titanium/tungsten (TiW) alloy layer (not shown), a chromium/copper (Cr/Cu) alloy layer (not shown) on top of the TiW alloy layer, and a copper (Cu) layer (not shown) on top of the Cr/Cu alloy layer. The BLM layer 170 can be formed by conventional PVD processes.

Next, with reference to FIG. 1J, in one embodiment, a photoresist layer 190 is formed on top of the BLM layer 170. The photoresist layer 190 can be formed by a conventional spin-on process.

Next, in one embodiment, the photoresist layer 190 is patterned resulting in a hole 192 of FIG. 1K such that the final via hole 162 aligns with the hole 192. In one embodiment, the hole 192 overlaps both the bottom capacitor plate 114 and the top capacitor plate 156 in the direction 115. The photoresist layer 190 can be patterned by a conventional lithographic process.

Next, with reference to FIG. 1K, in one embodiment, the hole 192 and the final via hole 162 are filled with an electrically conductive material resulting in an electrically conductive region 195 of FIG. 1L. As a result of the hole 192 overlapping both the bottom capacitor plate 114 and the top capacitor plate 156 in the direction 115, the electrically conductive region 195 overlaps both the bottom capacitor plate 114 and the top capacitor plate 156 in the direction 115. The electrically conductive material can comprise tin (Sn) and lead (Pb). The hole 192 and the final via hole 162 can be filled with the electrically conductive material by electroplating.

Next, with reference to FIG. 1L, in one embodiment, the photoresist layer 190 is removed resulting in the structure 100 of FIG. 1M. The photoresist layer 190 can be removed by a wet etching process.

Next, with reference to FIG. 1M, in one embodiment, the BLM layer 170 is patterned resulting in the BLM region 170 of FIG. 1N. The BLM layer 170 can be patterned by a $H_2O_2$-based wet etch or dry etch process followed by electroetching using the electrically conductive region 195 as a blocking mask.

Next, with reference to FIG. 1N, the electrically conductive region 195 is heated and reshaped by a reflow process resulting in the solder ball 195 on the BLM region 170 as shown in FIG. 1O. FIG. 1O' shows a top-down view of the structure 100 of FIG. 1O. For simplicity, in FIG. 1O', only the solder ball 195, the bottom capacitor plate 114, the top capacitor plate 156, the bond pad 155, and the gap region 132 are shown.

With reference to FIGS. 1O and 1O', the bottom capacitor plate 114, the top capacitor plate 156, and the gap region 132 constitute a gap capacitor 114+156+132. The gap capacitor 114+156+132 has (i) the bottom capacitor plate 114 and the top capacitor plate 156 as capacitor electrodes and (ii) the gap region 132 and portions of the dielectric layers 120 and 140 that overlap both the bottom capacitor plate 114 and the top capacitor plate 156 as capacitor dielectric region. It should be noted that the capacitance of the gap capacitor 114+156+132 depends on the distance in the direction 115 between the bottom capacitor plate 114 and the top capacitor plate 156. It should be noted that the bottom capacitor plate 114 and the top capacitor plate 156 are electrically connected to the capacitive sensor device 103 (not shown in FIG. 1O but can be seen in FIG. 1A) of the integrated circuit 102.

It should be noted that the stress in the solder ball 195 can cause a change in the distance in the direction 115 between the bottom capacitor plate 114 and the top capacitor plate 156 resulting in a change in capacitance of the gap capacitor 114+156+132. More specifically, if the stress in the solder ball 195 is compressive, then the distance in the direction 115 between the bottom capacitor plate 114 and the top capacitor plate 156 decreases and as a result, the capacitance of the gap capacitor 114+156+132 increases. Otherwise, if the stress in the solder ball 195 is tensile, then the distance in the direction 115 between the bottom capacitor plate 114 and the top capacitor plate 156 increases and as a result, the capacitance of the gap capacitor 114+156+132 decreases.

In one embodiment, the capacitive sensor device 103 is configured to determine the difference in capacitance of the gap capacitor 114+156+132 before and after the formation of the solder ball 195 (FIG. 1O). In other words, the capacitive sensor device 103 is configured to determine the difference in capacitance between the bottom capacitor plate 114 and the top capacitor plate 156 before and after the formation of the solder ball 195 (FIG. 1O). Then, the absolute value of the difference in capacitance is determined. If the absolute value of the difference in capacitance is greater than a pre-specified value, then the stress (which can be compressive or tensile) in the solder ball 195 is considered too high and therefore the design of the structure 100 is revised and/or the chip that includes the structure 100 is discarded.

In the embodiments described above, the gap capacitor 114+156+132 is electrically connected to the capacitive sensor device 103 (FIG. 1A) which is configured to determine the difference in capacitance of the gap capacitor 114+156+132 before and after the formation of the solder ball 195 (FIG. 1O). In an alternative embodiment, electrical paths (not shown) are formed that electrically connect the gap capacitor 114+156+132 to probe pads on the wafer (not shown). Therefore, the capacitance of the gap capacitor 114+156+132 can be measured before and after the formation of the solder ball 195 (FIG. 1O) by probing the probe pads. Then, the difference in capacitance of the gap capacitor 114+156+132 before and after the formation of the solder ball 195 (FIG. 1O) can be determined. Then, the absolute value of the difference in capacitance is determined. If the absolute value of the difference in capacitance is greater than the pre-specified value, then the stress (which can be compressive or tensile) in the solder ball 195 is considered too high and therefore the design of the structure 100 is revised and/or the chip that includes the structure 100 is discarded.

In the embodiments described above, the difference in capacitance of the gap capacitor 114+156+132 before and after the formation of the solder ball 195 (FIG. 1O) is determined. Alternatively, the difference in capacitance of the gap capacitor 114+156+132 between any two points in time of the fabrication process can be determined so as to monitor the stress to the regions close to the gap capacitor 114+156+132 resulting from the fabrication steps performed on the structure 100 between those two points in time of the fabrication process.

In yet another alternative embodiment, the gap capacitor 114+156+132 and another gap capacitor (not shown, but identical to the gap capacitor 114+156+132) are formed simultaneously on the layer 110. In this embodiment, the gap capacitor 114+156+132 and the solder ball 195 are near a corner of the chip (not shown) where stress in solder balls (like the solder balls 195) is likely high, whereas the another gap capacitor is formed at the center of the chip where stress in solder balls (like the solder balls 195) is likely low. Then, after all solder balls (including the solder ball 195) are formed on the layer 110, the capacitances of the gap capacitor 114+156+132 and the another gap capacitor can be measured, and the difference between the measured capacitance of the gap capacitor 114+156+132 and the capacitance of the another gap capacitor can be determined. Then, the absolute value of the difference in capacitance is determined. If the absolute value of the difference is greater than the pre-specified value, then design of the structure 100 is revised and/or the chip that includes the structure 100 is discarded.

In the embodiments described above, the solder ball 195 overlaps both the bottom capacitor plate 114 and the top capacitor plate 156 in the direction 115. In an alternative embodiment, the solder ball 195 overlaps only one capacitor plate of the bottom capacitor plate 114 and the top capacitor plate 156 in the direction 115. In another embodiment, the solder ball 195 does not overlap the bottom capacitor plate 114 or the top capacitor plate 156 in the direction 115, but is in close proximity to the bottom capacitor plate 114 and the top capacitor plate 156.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
  a dielectric layer which includes a top surface, wherein the top surface defines a reference direction perpendicular to the top surface;
  a bottom capacitor plate and an electrically conductive line on the dielectric layer,
    wherein the bottom capacitor plate comprises a first electrically conductive material, and
    wherein the electrically conductive line comprises a second electrically conductive material;
  a top capacitor plate on top of the bottom capacitor plate,
    wherein the top capacitor plate comprises a third electrically conductive material, and
    wherein the top capacitor plate overlaps the bottom capacitor plate in the reference direction;
  a gap region,
    wherein the gap region is sandwiched between the bottom capacitor plate and the top capacitor plate, and
    wherein the gap region does not comprise any liquid or solid material; and
  a solder ball on the dielectric layer,
    wherein the solder ball comprises a fourth electrically conductive material, wherein the solder ball is electrically connected to the electrically conductive line, and
    wherein the top capacitor plate is disposed between the dielectric layer and the solder ball.

2. The structure of claim 1, wherein a portion of the gap region entirely overlaps both the bottom capacitor plate and the top capacitor plate in the reference direction.

3. The structure of claim 1, wherein the solder ball overlaps at least one plate of the bottom capacitor plate and the top capacitor plate in the reference direction.

4. The structure of claim 3, wherein the solder ball overlaps both the bottom capacitor plate and the top capacitor plate in the reference direction.

5. The structure of claim 1, wherein the solder ball does not overlap the bottom capacitor plate or the top capacitor plate in the reference direction.

6. The structure of claim 1, further comprising a ball-limiting-metallurgy (BLM) layer,
    wherein the BLM layer comprises a fifth electrically conductive material,
    wherein the BLM layer is in direct physical contact with the solder ball, and
    wherein the BLM layer is disposed between the solder ball and the electrically conductive line.

7. The structure of claim 6, further comprising a bond pad,
    wherein the bond pad comprises a sixth electrically conductive material, and
    wherein the bond pad is in direct physical contact with and disposed between the electrically conductive line and the BLM layer.

8. The structure of claim 7, wherein the third electrically conductive material and sixth electrically conductive material are a same electrically conductive material.

9. The structure of claim 1, wherein the first electrically conductive material and second electrically conductive material are a same electrically conductive material.

10. The structure of claim 1, further comprising a capacitive sensor device,
    wherein the capacitive sensor device is electrically connected to both the bottom capacitor plate and the top capacitor plate, and
    wherein the capacitive sensor device is configured to determine a capacitance between the bottom capacitor plate and the top capacitor plate.

* * * * *